(12) United States Patent
Edwards et al.

(10) Patent No.: US 6,294,408 B1
(45) Date of Patent: Sep. 25, 2001

(54) METHOD FOR CONTROLLING THERMAL INTERFACE GAP DISTANCE

(75) Inventors: David L. Edwards; Michael J. Emmett, both of Poughkeepsie; Sushumna Iruvanti, Wappingers Falls, all of NY (US); Raed A. Sherif, Woodland Hills, CA (US); Kamal Sikka; Hilton T. Toy, both of Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/409,246

(22) Filed: Sep. 30, 1999

Related U.S. Application Data

(63) Continuation-in-part of application No. 09/226,458, filed on Jan. 6, 1999, now Pat. No. 6,218,730.

(51) Int. Cl.⁷ ................................................. H01L 21/48
(52) U.S. Cl. .......................... 438/121; 438/108; 438/118; 438/122
(58) Field of Search ................................... 257/704, 706, 257/707, 710, 712, 713, 717, 720, 778; 438/106, 108, 121, 122, 118, 119, 125; 361/697, 709, 711, 714

(56) References Cited

U.S. PATENT DOCUMENTS

| | | |
|---|---|---|
| 4,748,495 | 5/1988 | Kucharek . |
| 5,276,586 * | 1/1994 | Hatsuda et al. ........................ 361/387 |
| 5,366,688 | 11/1994 | Terpstra et al. . |
| 5,372,296 | 12/1994 | Konecke et al. . |
| 5,434,745 | 7/1995 | Shokrgozar et al. . |
| 5,465,470 | 11/1995 | Vongfuangfoo et al. . |
| 5,528,462 | 6/1996 | Pendse . |
| 5,545,473 | 8/1996 | Ameen et al. . |
| 5,552,635 * | 9/1996 | Kim et al. ............................. 257/706 |
| 5,585,671 * | 12/1996 | Nagesh et al. ........................ 257/697 |
| 5,591,034 | 1/1997 | Ameen et al. . |
| 5,604,978 | 2/1997 | Sherif et al. . |
| 5,623,394 | 4/1997 | Sherif et al. . |
| 5,789,810 * | 8/1998 | Gross et al. ........................... 257/704 |
| 5,881,944 * | 3/1999 | Edwards et al. ..................... 228/56.3 |
| 5,881,945 * | 3/1999 | Edwards et al. ................... 228/124.6 |
| 5,889,323 * | 3/1999 | Tachibana ............................. 257/704 |
| 5,982,038 * | 11/1999 | Toy et al. .............................. 257/772 |
| 6,041,501 * | 3/2000 | Suzuki et al. ........................ 29/890.1 |
| 6,091,603 * | 7/2000 | Daves et al. ......................... 361/704 |
| 6,218,730 * | 4/2001 | Toy et al. .............................. 257/704 |

FOREIGN PATENT DOCUMENTS

| | | |
|---|---|---|
| 63-169053 * | 7/1988 | (JP) . |
| 2-135762 * | 5/1990 | (JP) . |
| 2-135763 * | 5/1990 | (JP) . |
| 3-187247 * | 8/1991 | (JP) . |
| 5-55302 | 3/1993 | (JP) . |
| 5-114662 * | 5/1993 | (JP) . |

* cited by examiner

Primary Examiner—Olik Chaudhuri
Assistant Examiner—Alonzo Chambliss
(74) Attorney, Agent, or Firm—Ratner & Prestia; Ira D. Blecker, Esq.

(57) ABSTRACT

A method and apparatus for electronic chip assembly maintains a thin gap spacing between the chip and the lid or heat sink and provides for the electronic chip to operate at a relatively cool temperature. The thermal performance is enhanced by a thermal interface material provided in the thin gap and maintained at a minimal thickness as a result of the structure and assembly process. A thin thermal interface material layer may be achieved with a compression step to compress the thermal interface material before the sealant is cured. In addition, a vent hole is provided in the assembly to prevent pressure build-up inside the module during sealant cure. As the sealant is cured, the gap spacing is maintained, further compression of the thermal interface material is not required, and seal defects are prevented.

18 Claims, 8 Drawing Sheets

METHOD FOR CONTROLLING THERMAL INTERFACE GAP DISTANCE

RELATED APPLICATION

The present application is a continuation-in-part of U.S. patent application Ser. No. 09/226,458 titled "Apparatus For Controlling Thermal Interface Gap Distance," filed on Jan. 6, 1999, now U.S. Pat. No. 6,218,730, and assigned to the assignee of the parent application.

FIELD OF THE INVENTION

The present invention is generally directed to structures and methods for controlling the thickness of the gap between an electronic circuit chip and a lid, heat sink, or other cooling mechanism. More particularly, the present invention is directed to a system in which the size of the gap between the circuit chip and the lid or heat sink is controlled and preferably controlled so that this gap is as small as possible without deleteriously affecting the assembly process, chip integrity, or long-term performance. Even more particularly, the present invention is directed to an assembly method and system for controlling the thickness of paste material disposed between a chip and a lid or cover of a single chip or multi-chip module.

BACKGROUND OF THE INVENTION

As device integration levels continue to increase, the demand for a more efficient solution to the cooling of high power electronic circuit chips becomes an even more important ingredient in achieving required system performance. The use of thermal interface material (paste or grease) to cool single chip or multi-chip modules is highly desirable because of its simplicity and high thermal performance. Thermal interface materials are also not impacted by small particle contamination; hence, module assembly can be done in non-clean room environments, which is a factor in helping to reduce module assembly costs. Furthermore, module assembly can be done without demanding cooling schemes that use parts such as springs and pistons which may be sensitive to particle contamination. Further still, the compliance of thermal interface materials allows them to absorb mechanical tolerances which are associated with chip height and hardware variations.

It is desirable for electronic devices to operate at low temperatures for enhanced performance and reliability. This is particularly true for complimentary metal oxide semiconductor (CMOS) devices for which a reduction in temperature produces a gain in system speed. To a first order of approximation, the temperature of a flip chip is given by the following one-dimensional heat conduction equation:

$$T_{chip} = T_{air} + P_{chip} \times R_{int} + P_{mod} \times R_{ext}$$

In the case of a single chip module, the module power equals the chip power, and the above equation simplifies to:

$$T_{chip} = T_{air} + P_{chip} \times (R_{int} + R_{ext})$$

In the above equations, $R_{int}$ represents the internal thermal resistance of the module: the resistance from the chip, through the thermal interface material, to the module lid. $F_{ext}$ represents the thermal resistance external to the module: the lid-to-heat sink interface plus the heat sink resistance, including air heating effects.

The internal thermal resistance is composed of three resistances in series:

$$R_{int} = R_{chip} + R_{interface\ material} + R_{lid}$$

Because the lid is typically made of a high thermal conductivity material, such as aluminum, the thermal interface material resistance, which includes the interface resistance between the chip and interface material and between the interface material and lid, is the largest contributor to the internal thermal resistance, $R_{int}$. Reduction of the thermal interface material resistance is a significant factor, therefore, in reducing the overall device temperature.

The thermal resistance of the interface material is given by the following equation:

$$R_{interface\ material} = L_{gap}/(K_{interface\ material} \times A_{chip} \times C) + R_{interface}$$

where $L_{gap}$ is the thickness of the interface material between the chip and the module lid, $K_{interface\ material}$ is the interface material thermal conductivity, $A_{chip}$ is the area of the chip, and C is the percentage of the chip covered by the interface material. It is clear from this expression that, for constant chip size and coverage, reduction of the interface material thermal resistance, $R_{interface\ material}$, can be accomplished by (i) reduction of the interface material gap size, (ii) an increase in the thermal conductivity of the thermal interface material, or (iii) both.

Current designs rely on the compliance of the thermal interface material to accommodate variations in the thermal interface material gap arising due to hardware and chip height tolerances. The statistical variations of these tolerances are typically at least ±0.076 mm (±0.003 inches). Typical nominal gaps are 0.178 to 0.305 mm (0.007 to 0.012 inches). When high thermal conductivity interface materials are used, a large force is required to squeeze the interface material into even smaller gaps because high thermal conductivity interface materials typically have high solids loading and hence high viscosity. As a result, gaps of 0.178 mm (0.007 inches) or greater have been used.

Current methods for joining a substrate having a chip mounted upon it, and a lid to form a module, include a curing process. When the curing process is used to seal an encapsulated structure, the pressure that builds up within the module may create seal defects. In addition, seal defects can result when the curing process is also relied upon to compress the thermal interface material thickness to a thickness equal to the desired gap thickness.

To overcome the shortcomings of the current methods, a new structure and method are provided for controlling the gap between a chip and a module lid. An object of the present invention is to control the gap between the chip and a module lid while maintaining the chip and its interconnect structure within a sealed (hermetic or non-hermetic) environment. The sealed package is desirable to prevent moisture from contacting the chip and to maintain the interface material performance over long periods of time. Accordingly, the improved use of thermal interface material cooling, as incorporated in the present invention, becomes more efficient. It is another object of the present invention to provide a method for assembling a sealed module as described above, without the associated problems of internal pressure buildup or other sealing defects.

It is yet another object of the present invention to provide a method and apparatus for controlling the thickness of compliant thermally conductive material disposed between a chip and a lid in either a single chip or multi-chip module. Another object of the present invention is to improve the flow of heat away from an integrated circuit chip device. A related object of the present invention is to decrease operating temperatures, which increases the operating speed of electronic circuit chip devices and improves reliability. It is a still further object of the present invention to extend the performance range of thermal interface material cooling systems. It is also an object of the present invention to reduce the statistical variations in interface material gap tolerance in assembled electronic circuit chip modules.

A more specific object of the present invention is to reduce the gap between a thermally conductive lid and an electronic circuit chip which is encapsulated by the lid to a distance of 0.152 mm (0.006 inches) or less. Another object of the invention is to decrease seal defects and to increase assembly yield. It is still another object of the present invention to not only reduce but to also control the thickness of thermal interface materials disposed between electronic circuit chips and the packages which contain them.

SUMMARY OF THE INVENTION

To achieve these and other objects, and in view of its purposes, the present invention provides, in a preferred embodiment, an electronic flip chip assembly with controlled thermal interface material thickness. In particular, a substrate having electrical conductors is provided together with an electronic circuit chip which is affixed to the substrate so as to make electrical contact between the circuit chip and electrical conductors on the substrate. A thermal interface material is disposed on an upper side of the circuit chip. A substantially flat thermally conductive lid is disposed over the chip and in thermal contact with the interface material. In one embodiment, the lid possesses a greater horizontal extent than the chip and, therefore, has a lid portion which overhangs the chip. Furthermore, from this overhanging lid portion there depends a male lid sealing ring around the periphery of the lid. In addition, a corresponding female channel is also provided on the substrate. This channel has sidewalls. A sealant is disposed within the channel to form a seal between the sidewalls of the channel and the protruding lid sealing structure.

In another embodiment of the present invention, instead of using a female channel on the substrate, a female channel is disposed in the thermally conductive lid and a corresponding male sealing ring is disposed on the substrate. This male sealing ring has a T-shaped cross section with the vertical portion of the "T" extending into the sealant. The sealant is disposed between the sealing ring and the sidewalls of the female channel receptacle in the lid portion. In another embodiment, the male sealing ring may have an "L" shaped cross-section.

In yet another embodiment of the present invention, which also has a female receiving channel in the lid, a T-shaped male sealing ring is used. In this embodiment, however, the male sealing ring having a T-shaped cross section is disposed along the outer periphery of the substrate with the normally vertical portion of the "T" being disposed in a horizontal position sealed to the substrate. The normally horizontal cross section of the "T" extends upwardly into sealant disposed between the male sealing ring and the lid. This embodiment is particularly advantageous in those situations in which it is desirable that the lid extend beyond the substrate. In such an embodiment the lid not only overhangs the chip, but also overhangs the substrate. This embodiment is particularly useful in situations in which greater thermal heat sinking and heat spreading capabilities are desired.

In yet another embodiment, a female channel is provided in the lid and an intermediate male ring is first sealably affixed to the substrate and then subsequently disposed within the female channel portion of the lid. As in appropriate embodiments above, sealant material provided between a male portion and a female channel which is disposed within the lid. The sealant may be a curable polymer or solder, as appropriate.

In yet another embodiment of the present invention, the lid includes at least one vent hole to provide pressure relief to the package during the heating process. This feature reduces seal defects and allows the curing time to be reduced. After curing, the vent hole or holes is or are sealed with a material that can be cured at or near room temperature.

In another embodiment of the present invention, a preassembly compression step is used to compress the thermal interface material before the curing process. This step reduces the curing time needed, by insuring that the proper compression and interface material thickness are achieved before the sealant is cured.

In yet another embodiment of the present invention, female channel portions and male sealing members are not used. Instead, the lid has a downwardly extending sidewall so that the sealant material is positioned directly between the downwardly extending sidewall of the lid and the substrate.

In yet another embodiment of the present invention, lids and substrates with chips mounted upon them are presorted by the height of the mounted chip and the cavity depth of the lid, then matched, to provide a controlled uniform gap spacing.

It is to be understood that both the foregoing general description and the following detailed description are exemplary, but are not restrictive, of the invention.

DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Reference is made below to portions and components that are described as being either horizontal or vertical; these terms are relative. It is not essential that these components actually be oriented in the positions shown in the figures and, in particular, they may be inverted or disposed in directions rotated 90° from that shown or in fact rotated by any amount from that which is shown. In addition, it is also noted that circuit chips have two sides. One is the flat back side of the chip and the other is the face side from which electrical connections are made.

The present invention enhances the thermal performance of electronic module packages that are designed for increasingly higher power levels as a result of increased device integration, speed, and density. In particular, the present invention provides a method and apparatus for reducing the thermal interface material gap in a sealed electronic module or package. The advantage of this invention is that it improves module thermal performance by providing a shorter heat transfer path between the chip device and the module lid by using a controlled thermal path approach. The sealed module meets all product performance and reliability requirements.

The gap between the lid surface of the electronic chip which faces the lid is also preferably controlled in an exemplary embodiment of the present invention by mechanical standoffs with the result that the module is encapsulated with a variable-height seal joint. There is a decrease in the level of "tolerance buildup" when the chip device and the lid surface are directly referenced by these mechanical standoffs. For module designs in which variable-height seal joints are not provided, the chip and the lid gap may have large statistical tolerances, for example, ±0.076 mm to ±0.127 mm (±0.003 inches to ±0.005 inches). According to the exemplary embodiments of the present invention, however, the statistical variation can be reduced to ±0.025 mm to ±0.050 mm (±0.001 inches to ±0.002 inches) and the nominal gap can be reduced to below 0.15 mm (0.006 inches). In an alternative embodiment, the gap variation may be minimized by pre-sorting the chip-substrate and the lids before assembly. This gap dimension and tolerance reduction translates to significant thermal improvement, especially for high powered chips.

The present invention can be described in relation to several exemplary embodiments. In one exemplary embodiment, a non-hermetic module with a compliant thermal interface using thermal interface material between the chip device and the lid, together with the use of a U-shaped channel as a variable-height seal joint, is provided. In another exemplary embodiment, a T-shaped male sealing ring is used as a variable-height seal joint.

Figure 1:
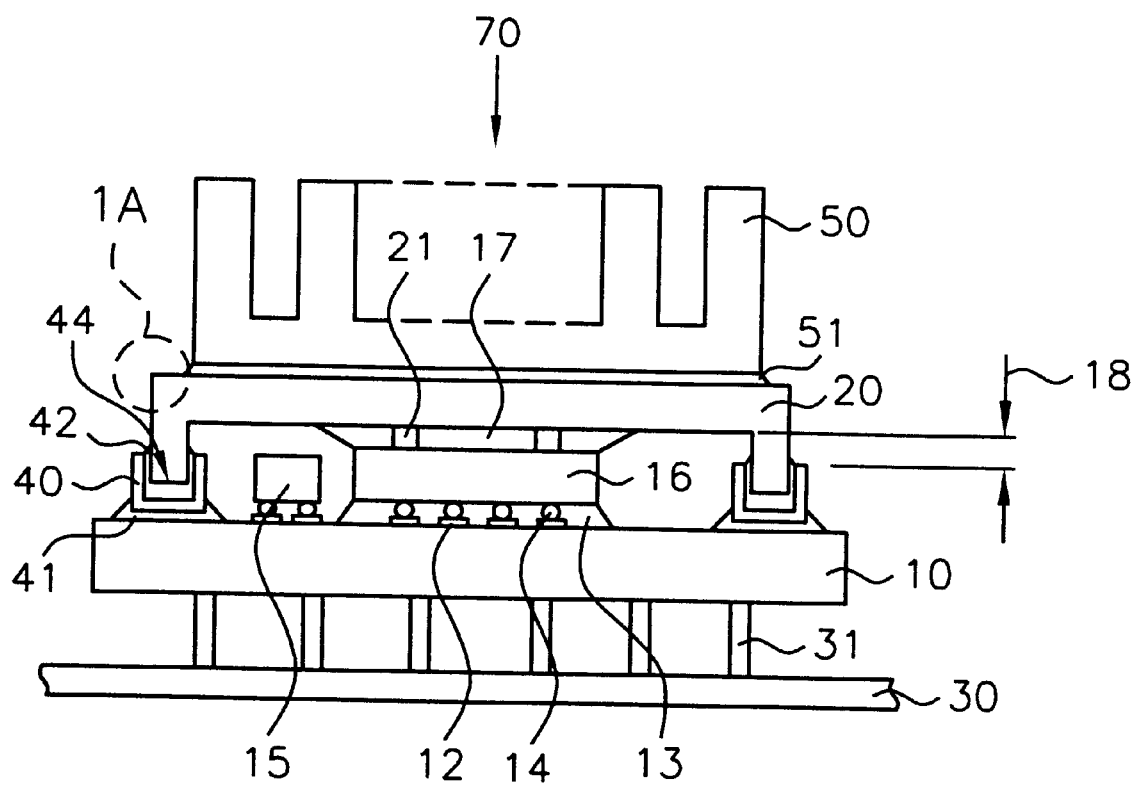
FIG. 1 is a cross-sectional view in accordance with one embodiment of the present invention which incorporates a separately provided U-shaped female receiving channel.

FIG. 1 illustrates an exemplary embodiment of the present invention incorporating a single chip module (SCM). A chip device 16 is connected to a substrate 10. A lid 20 is joined to substrate 10 through a sealant 42. A thermal interface material 17 provides a cooling path between chip device 16 and lid 20. The embodiment in FIG. 1 in particular illustrates an SCM assembly process with "flip chip" manufacturing. A heat sink 50 is attached to lid 20 with conductive adhesive 51 to further enhance module cooling.

Typically, chip device 16 is secured by solder balls 14 and substrate pads 12 to substrate 10. Electrical conductors are disposed within substrate 10 to provide connection to and from chip device 16. Substrate 10 also typically includes one or more discrete devices 15 such as capacitors, resistors, and the like. These discrete devices 15 are secured in the same way as chip device 16 via corresponding solder balls 14 and substrate pads 12. A device underfill material 13 is applied to solder balls 14 or to device interconnects in order to enhance solder joint fatigue life because of coefficient of thermal expansion (CTE) mismatches of the materials during thermal cycling.

Substrate interconnect pins 31 are used to directly attach to card assembly 30 or to a printed circuit board (PCB). For purposes of convenience, simplicity, and ease of understanding, heat sink 50 and card assembly 30 are not specifically shown in FIGS. 2–8. It should be understood, however, that these components may additionally be included in the embodiments shown in FIGS. 2–8.

The invention shown in FIG. 1 illustrates a method for reducing and controlling the chip-to-lid gap variation in a sealed module. The thermal gap 18 is preferably controlled by incorporating standoffs 21 between chip device 16 and lid 20. Lid 20 may be formed of copper, aluminum, or other suitable materials, to enhance thermal conductivity.

Figure 1A:
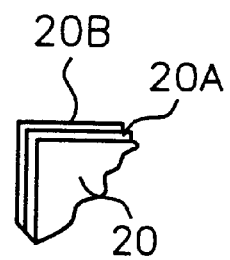
FIG. 1A is an expanded cross-sectional view of a portion of the lid shown in FIG. 1.

As shown in the cross-sectional view of FIG. 1A, which is a detailed view of the circled region "A" of FIG. 1, additional films may be added to protect lid 20 from environmental conditions and to prevent oxidation. In a preferred embodiment, a nickel film 20a is formed on the surface of copper lid 20 by plating. The nickel may be flash-plated to produce a thickness of 1–10 microns of nickel film 20a and may be within the range of 1–5 microns most preferably. In an exemplary embodiment, an additional film 20b may be formed on nickel film 20a to enhance adhesion of sealant 42 to lid 20. In an exemplary embodiment, chromium may be plated to produce an additional film 20b having a thickness within the range of 0.1 to 5 microns. In the preferred embodiment, additional film 20b has a thickness of 0.1 to 2 microns.

Standoffs 21 are, for example, individual disks that are placed between chip device 16 and lid 20 during assembly. Alternatively, in the preferred embodiment, standoffs 21 are integral parts of lid 20, meaning that standoffs 21 and lid 20 are monolithic and are formed as one piece. Standoffs 21 may be any convenient shape. When standoffs 21 are used, direct thermal gap control is achieved based on the tolerance of standoffs 21. In order to provide a seal around the module, however, a lower sealing member in the form of U-shaped "female" channel 40 is first affixed to substrate 10 with sealing material 41. Sealing material 41 preferably comprises a material such as a compliant silicone adhesive. Compliant thermal interface material 17 is applied between chip device 16 and lid 20, specifically to the location on lid 20 where chip device 16 is to be disposed.

Lid 20 with standoffs 21 is then placed in position so that the upper sealing member, peripheral male edge sealing member 44, "floats" inside U-shaped channel 40. In a non-hermetic embodiment, U-shaped channel 40 contains a non-hermetic sealant 42. In this non-hermetic embodiment, the module is placed in a fixture which applies a load 70 along a joining direction, and the module is cured in a box-type convection oven or other heating and cooling apparatus.

FIGS. 2 through 5 show alternative embodiments of the assembled module including substrate 10, chip device 16 mounted on substrate 10, and lid 20 joined to substrate 10. Standoffs 21 are included and the alternative embodiments are assembled according to the same principles as discussed above with reference to FIG. 1. The embodiments shown in FIGS. 2 through 5 differ, however, in the configuration and orientation of the peripheral upper and lower sealing members which are joined by sealant 42.

Figure 2:
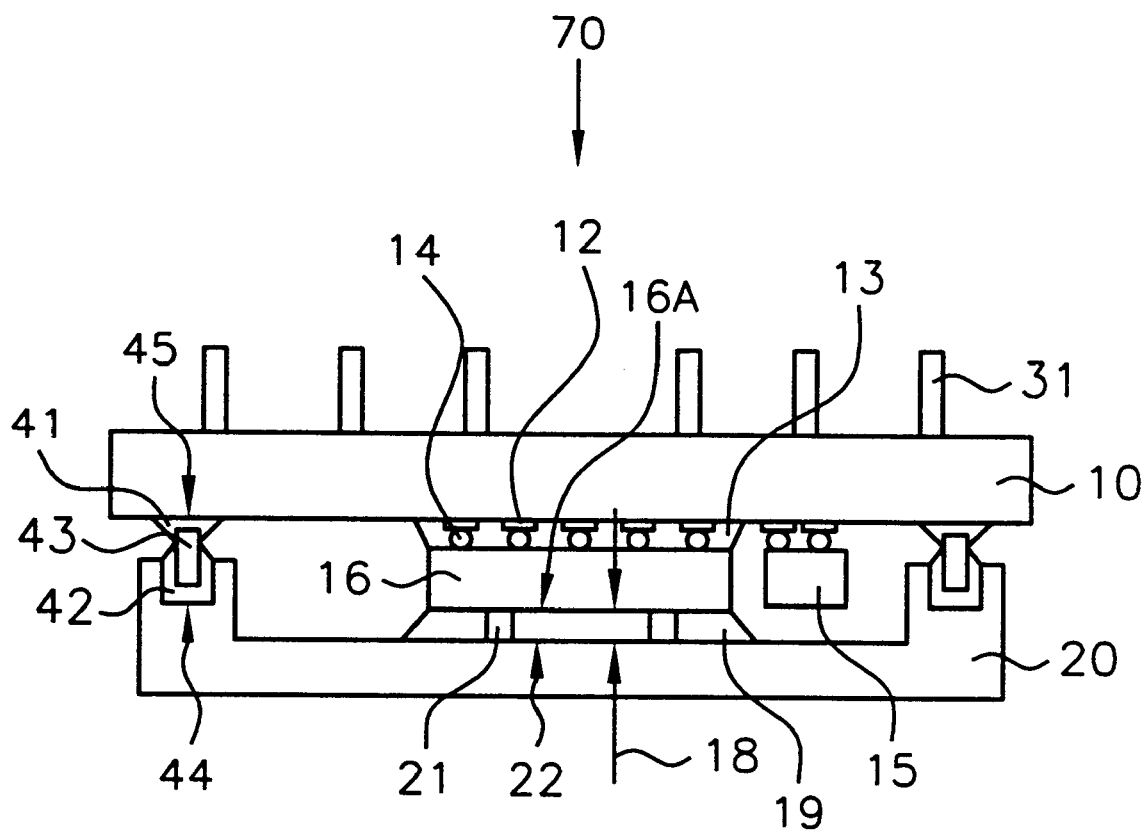
FIG. 2 is a cross-sectional side elevation view illustrating another embodiment of the present invention in which a U-shaped female receiving channel is provided in the lid structure.

More specifically, for example, FIG. 2 illustrates an embodiment of the present invention in which a metal thermal interface material 19 is used between chip device 16 and lid 20. The backside 16a of chip device 16 is preferably metallized, for example with nickel or gold, to improve solderability. A seal ring 43 is attached to substrate 10 by sealing material 41. Lid 20 has an area 22 metallized with nickel and selective gold plating to improve solderability. The substrate seal area 45 may also be metallized using nickel or gold.

Figure 4:
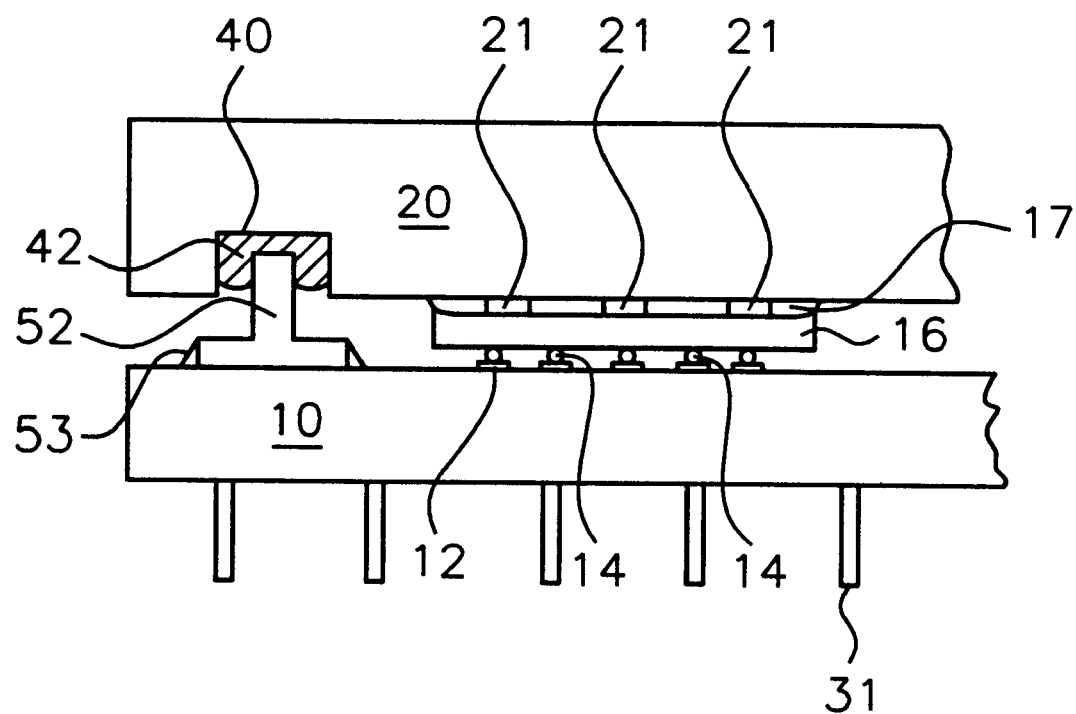
FIG. 4 is a cross-sectional side elevation view of an embodiment of the present invention in which a receiving channel structure is provided in the lid.
Figure 5:
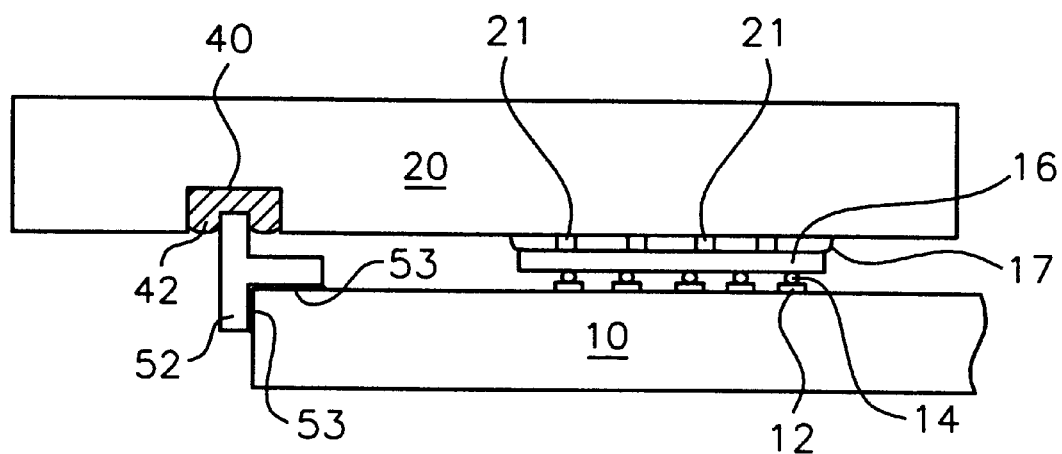
FIG. 5 is a cross-sectional side elevation view of an embodiment of the present invention similar to FIG. 4 except that the male sealing ring structure is disposed around the periphery of the substrate so as to provide for the possibility that the lid can extend both beyond the chip and beyond the substrate.

Shown in FIG. 4 is an embodiment in which a seal ring 52 having a T-shaped cross section is sealably affixed by a sealant 53 to substrate 10. As shown, seal ring 52 has an inverted "T" configuration with its leg extending into sealant 42 disposed in U-shaped female channel 40 in lid 20. The head of seal ring 52 is affixed to substrate 10. In FIG. 5, a similar structure is shown except that seal ring 52 is oriented with its leg and a portion of its head affixed by sealant 53 to substrate 10. The opposite portion of the head of seal ring 52 is disposed in female channel 40 in lid 20 and affixed to lid 20 by sealant 42.

In each of the embodiments, a single chip module (SCM) is used as an example. Multi-chip modules (MCM) with more than one chip also benefit, however, from the direct thermal gap control approach of the present invention to improve module thermal performance. In particular, standoffs 21 may be disposed on some or all of the chips to provide a controlled thermal gap for non-hermetically sealed multi-chip modules. Another feature of the present invention is the pressure relief or vent hole shown in FIG. 6. It should be understood that the pressure relief feature (vent hole 23) shown in FIG. 6 may alternatively be included in the embodiments shown in FIGS. 1–5.

Figure 6:
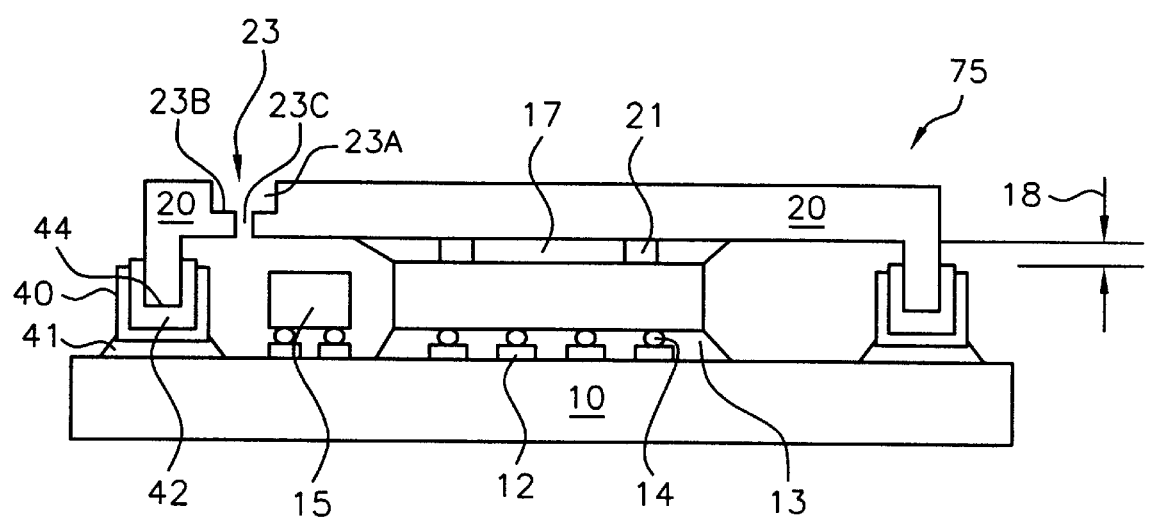
FIG. 6 is a cross-sectional side elevation view of an embodiment of the present invention including a vent hole.

Lid 20 shown in FIG. 6 includes vent hole 23. Vent hole 23 provides pressure equilibrium between the inside and outside of module 75 during the sealant curing process. In the embodiments shown in FIGS. 1–5, pressure increases inside the package during the heating process used to cure the sealant 42. This curing process occurs after lid 20 and substrate 10 have been joined by use of a physical force to bring lid 20 and substrate 10 together at a point where sealant 42 causes the joined components to adhere to one another to form module 75.

After being physically joined, as above, module 75 is heated during the curing process. As the air encapsulated inside module 75 becomes heated, internal pressure builds up. This internal pressure buildup may lead to blowout of sealant 42. Vent hole 23 provides an outlet through which this internal pressure is released.

Figure 7:
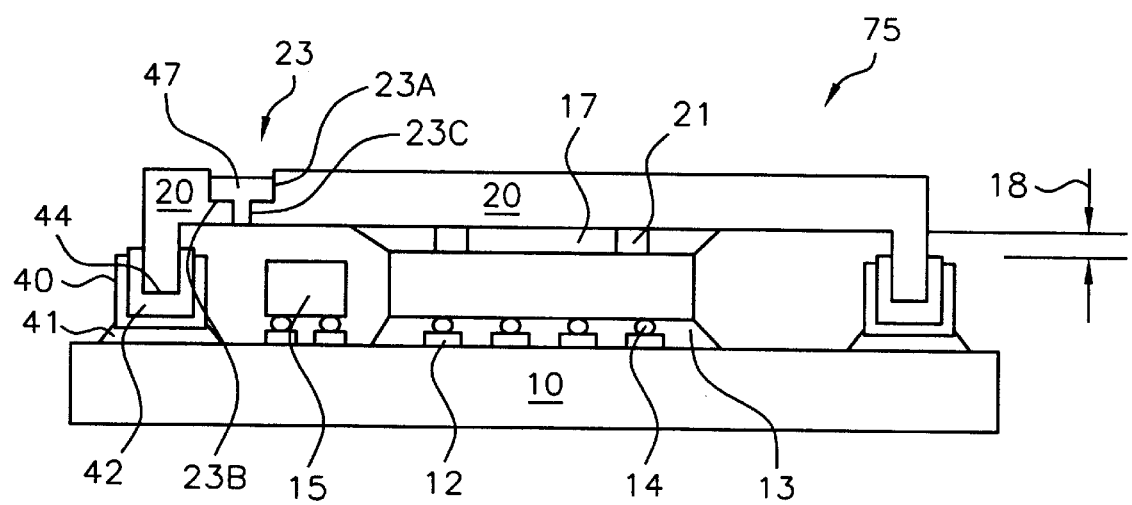
FIG. 7 is the device shown in FIG. 6 after an ultraviolet-curable material has been added to seal the vent hole.

In the preferred embodiment, pressure relief vent hole 23 is formed in lid 20 and includes a lower section 23C, a terrace 23B, and an upper section 23A. In the preferred embodiment, lower section 23C has a diameter of 0.38 mm (0.015 inches) and upper section 23A has a diameter of 2.54 mm (0.100 inches). After sealant 42 is cured by heating module 75, and the pressure stabilized as the heated air is released through vent hole 23 during the curing process. Pressure relief vent hole 23 is then filled with an adhesive material which is curable at room temperature or at slightly elevated temperature, or by ultraviolet (uv)-curing means such as adhesive material 47 as shown in FIG. 7. Adhesive material 47 is held in place within the counter bore of upper section 23A due to mass and surface tension, thus preventing adhesive material 47 from leaking into module 75. In one exemplary embodiment using a room-temperature curable adhesive material 47, after adhesive material 47 is introduced into vent hole 23, it is allowed to cure at room temperature.

In another exemplary embodiment, adhesive material 47 may be a uv-curable material. After uv-curable adhesive material 47 is introduced into vent hole 23, module 75 is exposed to a uv-source to cure uv-curable adhesive material 47 thereby sealing module 75. By using a uv-curable or room temperature curable adhesive material 47, additional heating is not required to cure the material. In this manner, module 75 is not subjected to an additional heating process which may cause a differential pressure problem within the sealed module 75. The uv-sealed module 75 is considered to be non-hermetically sealed.

Although only one vent hole 23 is shown in the cross-sectional view illustrated in FIG. 6, it should be understood that this is an exemplary embodiment only. In alternative embodiments, several vent holes 23 are used to achieve the pressure relief feature of the present invention.

Figure 8:
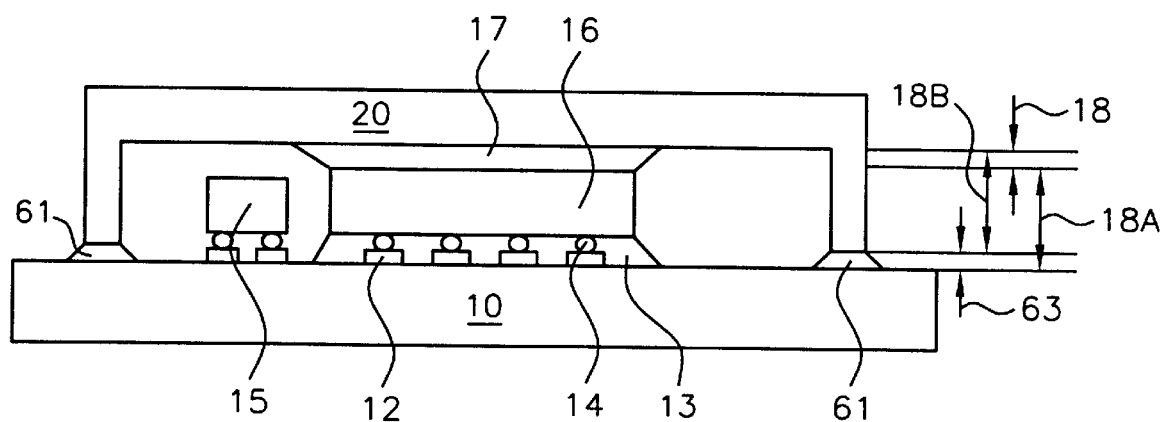
FIG. 8 is a side elevation view in accordance with another embodiment of the present invention for which standoffs are not required.

In FIG. 8, a controlled interface material gap module can be achieved without the use of standoffs 21 (shown in FIGS. 1 through 7) between chip device 16 and lid 20. In the embodiment shown in FIG. 8, the thermal gap 18 is controlled by determining the hardware dimensions of the substrate-to-chip device height 18A and the lid cavity depth 18B before assembly and by controlling the thickness 63 of the sealing material 61. After chip device 16 has been joined to substrate 10, the substrate-to-chip device height 18A can be measured mechanically by height gauge or optically by scanning techniques. The cavity depth 18B of lid 20 can be measured using similar techniques. Sealing material 61 has a controlled thickness 63 after lid 20 is attached to substrate 10. In a manufacturing environment, both the chip-on-substrate assemblies and the lids can be pre-measured before assembly and sorted to ensure that the assembled modules include a uniform, thin, interface material thermal gap 18 which will preferably be within the 0.025 to 0.15 mm (0.001 to 0.006 inches) range, and most preferably within the 0.10 to 0.15 mm (0.004 to 0.006 inches) range. In the embodiment of FIG. 8, therefore, standoffs 21 are not required.

Figure 3:
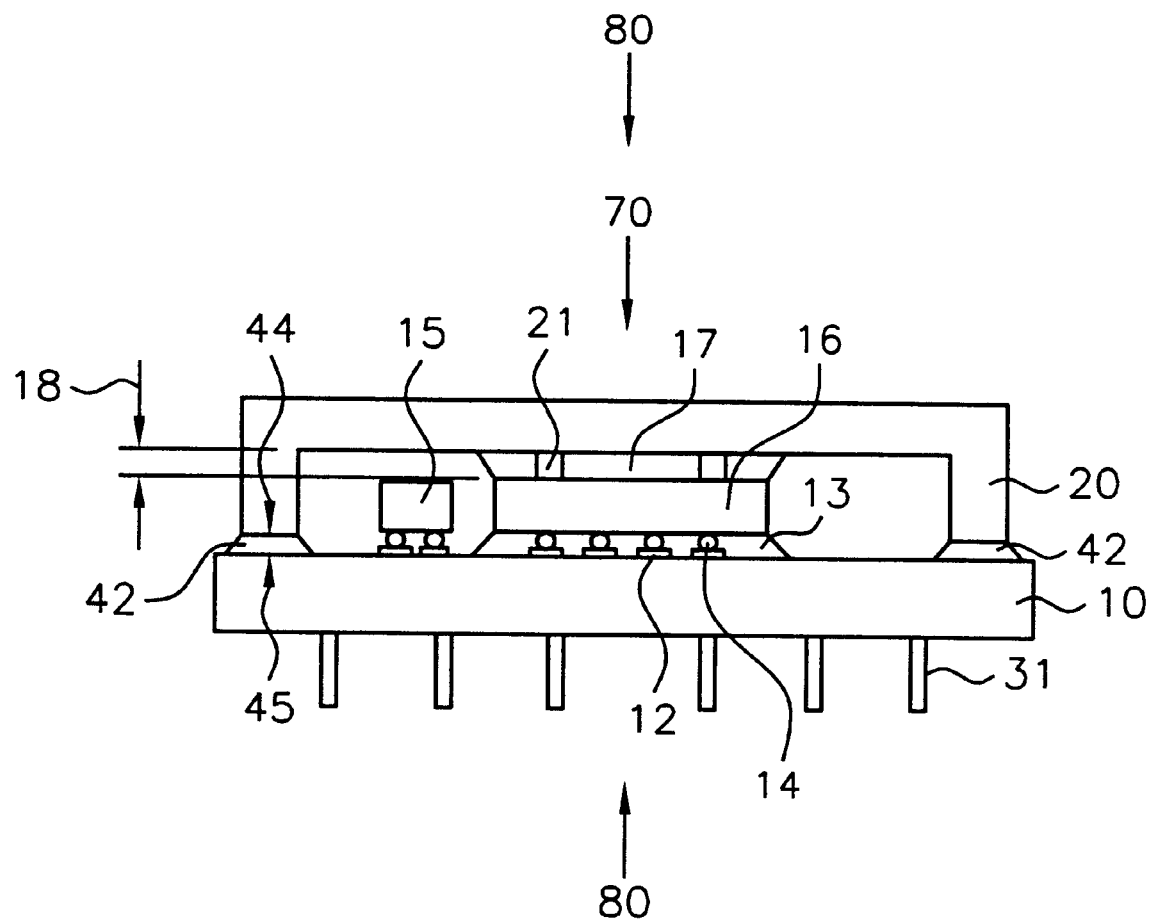
FIG. 3 is a cross-sectional side elevation view of an embodiment of the present invention which has neither channels nor male sealing rings but instead relies upon compliant sealant material.

It is another object of the present invention to provide a process for assembling the modules using a pre-curing, compression step. Referring to FIG. 3, for example, thermal interface material 17 which is used to fill thermal gap 18 is typically a viscous material, and the force needed to compress it is a function of the viscosity of the material, the surface area of chip device 16, the temperature during compression, and the desired thickness of thermal gap 18. As the thickness of the thermal interface material 17 decreases, its resistance to additional compression during the assembly process increases. In the final assembly process, sealant 42 is not compressed to its desired thickness until thermal interface material 17 is also compressed to the thickness desired for thermal gap 18. It is desirable for sealant 42 and thermal interface material 17 to be physically compressed to a final thickness before the curing process so that, during the cure cycle, sealant 42 can "set-up" and be cured without movement of lid 20 relative to substrate 10 due to softening of thermal interface material 17.

In order to position lid 20 and substrate 10 in their permanent relative locations before the elevated-temperature curing process, the module is subjected to a high pre-curing force of short duration to overwhelm the viscous resistance of the thermal interface material 17. This force is applied at room temperature to join the two pieces. The force (load 70) is directed along the joining direction 80 and may range from 15 to 100 pounds in various embodiments and will most preferably be within the range of 50 to 80 pounds. In the preferred embodiment, a plunger may be used to apply load 70 along joining direction 80, but other methods and equipment for applying a mechanical force may be used in alternative embodiments.

By applying such a force at room temperature, thermal interface material 17 is essentially compressed to its final thickness, which is also the desired thickness for thermal gap 18. Sealant 42 is also essentially compressed to its final dimensions before curing. Therefore, during the subsequent curing process at elevated temperature, relative shifting of the components forming the module, due to additional compression or re-distribution of either thermal interface material 17 or sealant 42, will be minimized or eliminated because they have achieved their final dimensions during the pre-curing compression step. The pre-curing, compression step assures proper interface material compression, thereby assuring the desired level of thermal performance, and minimizes the possibility of seal defects.

After the pre-curing step, the compression force is removed and a lesser or equal force is applied and maintained to hold the parts in position for the duration of the cure cycle. In the preferred embodiment, a lesser force is used and may be provided by a spring-loaded unit. The lesser force may range from 1 to 20 pounds of force applied along joining direction 80 and, most preferably, will lie within the range of 5 to 15 pounds. In an alternative embodiment, other mechanisms for applying a mechanical force along the joining direction 80 may be used.

The curing process is a thermal process, the details of which vary based largely upon the sealant 42 used. Temperatures ranging from 100° C. to 200° C. are common and curing times commonly range from 30 minutes to 5 hours. In a preferred exemplary embodiment, the curing process may include a temperature of 150° C. for a time of 2 hours.

Without the pre-curing compression step, two undesirable problems may arise: (i) the thermal interface material 17 may be too resistant to compression for normal assembly springs to compress, so that the desired thickness of thermal gap 18 is never achieved; and (ii) the assembly spring may not be strong enough to compress thermal interface material 17 until the thermal interface material 17 is sufficiently heated during the cure cycle. To overcome this, a hotter or longer cure cycle may be needed, which may cause the sealant 42 to be further compressed or redistributed during the curing process, potentially causing seal defects. The pre-curing, compression step assures proper compression of thermal interface material 17, assuring the desired level of thermal performance, and minimizes the possibility of seal defects.

Although illustrated and described above with reference to certain specific embodiments and examples, the present invention is nevertheless not intended to be limited to the details shown. Rather, various modifications may be made in the details within the scope and range of equivalents of the claims and without departing from the spirit of the invention.

What is claimed:

1. A method for assembling an electronic chip assembly, comprising the steps of:
    (a) providing a substrate having a surface with at least one electronic circuit chip affixed to the surface and at least one connection location on the surface;
    (b) providing a lid adapted for covering the at least one chip and including an upper sealing member for coupling to the substrate;
    (c) applying a thermal interface material over a surface of the chip, the thermal interface material having an original thickness greater than a final gap spacing;
    (d) applying a sealant to at least one of the upper sealing member and the at least one connection location on the surface of the substrate disposed for coupling the upper sealing member to the at least one connection location;
    (e) applying a first force thereby joining the substrate to the lid, the upper sealing member being coupled to the substrate, the lid covering the chip and contacting the thermal interface material, the thermal interface material being compressed to a final thickness, wherein the first force is within the range of 15 to 100 pounds along a joining direction; and
    (f) curing the sealant by heating and applying a second force being at most equal to the first force,
wherein the final gap spacing comprises a distance between a lower surface of the lid and the top surface of the chip in the electronic chip assembly.

2. The method as in claim 1, in which the final thickness is essentially equal to the final gap spacing.

3. The method as in claim 1, wherein the first force is applied by a plunger.

4. The method as in claim 1, wherein the heating is performed at a temperature within the range of 100° C. to 200° C. and for a time period ranging from 30 minutes to five hours.

5. The method as in claim 1, in which the step (f) includes applying a mechanical force ranging from 5 to 15 pounds along a joining direction.

6. The method as in claim 1, wherein the second force is applied by a spring-loading mechanism.

7. A method for assembling an electronic chip assembly, comprising the steps of:
    (a) providing a substrate having a surface with an electronic circuit chip affixed to the surface and at least one connection location on the surface;
    (b) providing a lid covering the chip and including an upper sealing member for coupling to the substrate;
    (c) applying a sealant to at least one of the upper sealing member and the at least one connection location on the surface of the substrate disposed for coupling the upper sealing member to the at least one connection location;
    (d) applying a thermal interface material over a top surface of the chip, the thermal interface material having an original thickness greater than a final gap spacing;
    (e) applying a first force thereby joining the substrate to the lid, the upper sealing member being coupled to the substrate, the lid covering the chip and contacting the thermal interface material, the thermal interface material being compressed to a final thickness, wherein the first force is within the range of 15 to 100 pounds along a joining direction; and
    (f) curing the sealant by heating and applying a second force being at most equal to the first force,
wherein the final gap spacing comprises a distance between a lower surface of the lid and the top surface of the chip in the electronic chip assembly.

8. The method as in claim 7, in which the final thickness is essentially equal to the final gap spacing.

9. A method for manufacturing an electronic flip chip assembly comprising a substrate, a chip, a lid connected to said chip through a thermal interface layer having a predetermined desired thickness, said lid comprising a greater horizontal extent than the chip and having a lid portion which overhangs the chip, wherein the method comprises:

(a) forming on said lid and said substrate complementary male and female parts of a sealing structure;

(b) depositing on an upper surface of said chip a pliant, heat-conductive material to a first thickness greater than said predetermined desired thickness;

(c) applying a pliant curable adhesive to one or both of said complementary male and female parts of said sealing structure;

(d) placing said lid over said chip in contact with said pliant, heat-conducting material with said complementary male and female parts of said sealing structure aligned with each other;

(e) applying a first force to said lid and said chip along a joining direction sufficient to compress said pliant, heat-conducting material to said predetermined desired thickness and to compress said pliant adhesive engaging said complementary male and female parts of said sealing structure wherein said first force is within the range 15 to 100 pounds;

(f) replacing said first force with a second force also applied to said lid and said chip along a joining direction sufficient to maintain said predetermined desired thickness;

(g) curing said curable adhesive while applying said second force; and (h) removing said second force after said adhesive has cured at least sufficiently to retain said lid on said chip with said pliant, heat-conductive material in substantially said predetermined desired thickness when said second force is removed.

10. The method according to claim 9 wherein the step of forming on said lid and said substrate complementary male and female parts of a sealing structure further comprises:

forming on said lid a channel dimensioned to surround said chip when said lid is positioned over said chip; and forming a male sealing ring having a height extending from said substrate into said channel in said lid when said lid is positioned on said substrate, said height being such that said ring does not impede the compression of said pliant, heat-conductive material to said predetermined desired thickness during the step of applying said first force.

11. The method according to claim 10 wherein the step of forming on said lid and said substrate complementary male and female parts of a sealing structure further comprises:

forming on said substrate a channel dimensioned to surround said chip when said chip is positioned on said substrate; and forming on said lid a male sealing ring having a height extending from said lid into said channel in said substrate when said lid is positioned on said substrate, said height being such that said ring does not impede the compression of said pliant, heat conductive material to said predetermined desired thickness during the step of applying said first force.

12. The method according to claim 10 wherein said second force is within the range of 5 to 15 pounds.

13. The method according to claim 9 wherein said first force is applied using a plunger.

14. The method according to claim 12 wherein said second force is applied using a spring.

15. The method according to claim 10 wherein said first force is applied while the pliant, heat-conductive material is at substantially room temperature.

16. The method according to claim 10 wherein said pliant, heat-conductive material comprises a plurality of substantially non-compressible particles and wherein said step of compressing said heat-conductive material terminates when said lid contacts said non-compressible particles.

17. The method according to claim 10 wherein said pliant, heat-conductive material comprises a substantially non-compressible shim and wherein said step of compressing said heat-conductive material terminates when said lid contacts said non-compressible shim.

18. The method according to claim 10 further comprising, prior to the step of placing said lid over said chip, forming an opening in said lid, the opening sized, shaped, and positioned to permit gasses produced during said curing step to escape from under said lid.

* * * * *